(12) United States Patent
Lee et al.

(10) Patent No.: US 11,665,891 B2
(45) Date of Patent: May 30, 2023

(54) ONE-TIME PROGRAMMABLE MEMORY CELL AND FABRICATION METHOD THEREOF

(71) Applicant: UNITED MICROELECTRONICS CORP., Hsin-Chu (TW)

(72) Inventors: Kuo-Hsing Lee, Hsinchu County (TW); Chang-Chien Wong, Tainan (TW); Sheng-Yuan Hsueh, Tainan (TW); Ching-Hsiang Tseng, Tainan (TW); Chi-Horn Pai, Tainan (TW); Shih-Chieh Hsu, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 180 days.

(21) Appl. No.: 17/314,061

(22) Filed: May 7, 2021

(65) Prior Publication Data
US 2022/0328503 A1 Oct. 13, 2022

(30) Foreign Application Priority Data
Apr. 13, 2021 (CN) .......................... 202110393219.2

(51) Int. Cl.
*H10B 20/20* (2023.01)
(52) U.S. Cl.
CPC .................................... *H10B 20/20* (2023.02)
(58) Field of Classification Search
CPC ....................... H01L 27/11206; H01L 23/5252
See application file for complete search history.

(56) References Cited

U.S. PATENT DOCUMENTS

| | | | |
|---|---|---|---|
| 7,531,886 B2 | 5/2009 | Chakravarti | |
| 8,035,191 B2 | 10/2011 | Lin | |
| 8,361,887 B2 | 1/2013 | Cestero | |
| 9,837,424 B2* | 12/2017 | Yamamoto | ............. H01L 21/84 |
| 10,074,660 B2* | 9/2018 | Kasai | ..................... G11C 17/16 |

\* cited by examiner

*Primary Examiner* — Allison Bernstein
(74) *Attorney, Agent, or Firm* — Winston Hsu

(57) ABSTRACT

A one-time programmable (OTP) memory cell includes a substrate comprising an active area surrounded by an isolation region, a transistor disposed on the active area, and a diffusion-contact fuse electrically coupled to the transistor. The diffusion-contact fuse includes a diffusion region in the active area, a silicide layer on the diffusion region, and a contact partially landed on the silicide layer and partially landed on the isolation region.

14 Claims, 5 Drawing Sheets

ONE-TIME PROGRAMMABLE MEMORY CELL AND FABRICATION METHOD THEREOF

BACKGROUND OF THE INVENTION

1. Field of the Invention

The invention relates to the field of semiconductor technology, in particular to a one-time programmable memory cell and a manufacturing method thereof.

2. Description of the Prior Art

A programmable resistive device is generally referred to a device's resistance states that may change after means of programming. Resistance states can also be determined by resistance values. For example, a resistive device can be a one-time programmable (OTP) device, such as electrical fuse, and the programming means can apply a high voltage to induce a high current (e.g., tens of milliamps) to flow through the OTP element. When a high current flows through an OTP element by turning on a program selector, the OTP element can be programmed, or burned into a high or low resistance state (depending on either fuse or anti-fuse).

An electrical fuse is a common OTP which is a programmable resistive device that can be constructed from a segment of interconnect, such as polysilicon, silicided polysilicon, silicide, metal, metal alloy, or some combination thereof. The metal can be aluminum, copper, or other transition metals. The electrical fuse can be one or more contacts or vias. A high current may blow the contact(s) or via(s) into a very high resistance state. However, large driving elements are required to generate the high current, which makes it difficult for the element size to be further reduced.

SUMMARY OF THE INVENTION

It is one object of the present invention to provide a one-time programmable memory cell and a manufacturing method thereof to solve the above-mentioned shortcomings or deficiencies of the prior art.

According to one aspect of the invention, a one-time programmable (OTP) memory cell includes a substrate comprising an active area surrounded by an isolation region; a transistor disposed on the active area; and a diffusion-contact fuse electrically coupled to the transistor. The diffusion-contact fuse comprises a diffusion region in the active area, a silicide layer on the diffusion region, and a contact partially landed on the silicide layer and partially landed on the isolation region.

According to some embodiments, the diffusion region comprises an $N^+$ doped region or a $P^+$ doped region.

According to some embodiments, the transistor comprises a source doped region, a drain doped region, a channel region between the source doped region and the drain doped region, and a gate above the channel region.

According to some embodiments, the source doped region is contiguous with the diffusion region.

According to some embodiments, a width of the source doped region is greater than a width of the diffusion region.

According to some embodiments, the contact is disposed at a distal end of the diffusion region that is opposite to the source doped region.

According to some embodiments, the transistor is an NMOS transistor.

According to some embodiments, the diffusion region is a strip shaped diffusion region.

According to some embodiments, the silicide layer comprises NiSi.

According to some embodiments, the contact is a tungsten contact.

According to another aspect of the invention, a method of forming a one-time programmable (OTP) memory cell is disclosed. A substrate comprising an active area surrounded by an isolation region is provided. A transistor is formed on the active area. A diffusion-contact fuse electrically coupled to the transistor is formed. The diffusion-contact fuse comprises a diffusion region in the active area, a silicide layer on the diffusion region, and a contact partially landed on the silicide layer and partially landed on the isolation region.

According to some embodiments, the diffusion region comprises an $N^+$ doped region or a $P^+$ doped region.

According to some embodiments, the transistor comprises a source doped region, a drain doped region, a channel region between the source doped region and the drain doped region, and a gate above the channel region.

According to some embodiments, the source doped region is contiguous with the diffusion region.

According to some embodiments, a width of the source doped region is greater than a width of the diffusion region.

According to some embodiments, the contact is disposed at a distal end of the diffusion region that is opposite to the source doped region.

According to some embodiments, the transistor is an NMOS transistor.

According to some embodiments, the diffusion region is a strip shaped diffusion region.

According to some embodiments, the silicide layer comprises NiSi.

According to some embodiments, the contact is a tungsten contact.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The present invention pertains to a one-time programmable (OTP) memory cell, the main feature of which is that a diffusion-contact fuse is adopted to achieve the effect of reducing the programming current while maintaining a high degree of read stability (robust read stability).

Figure 1:
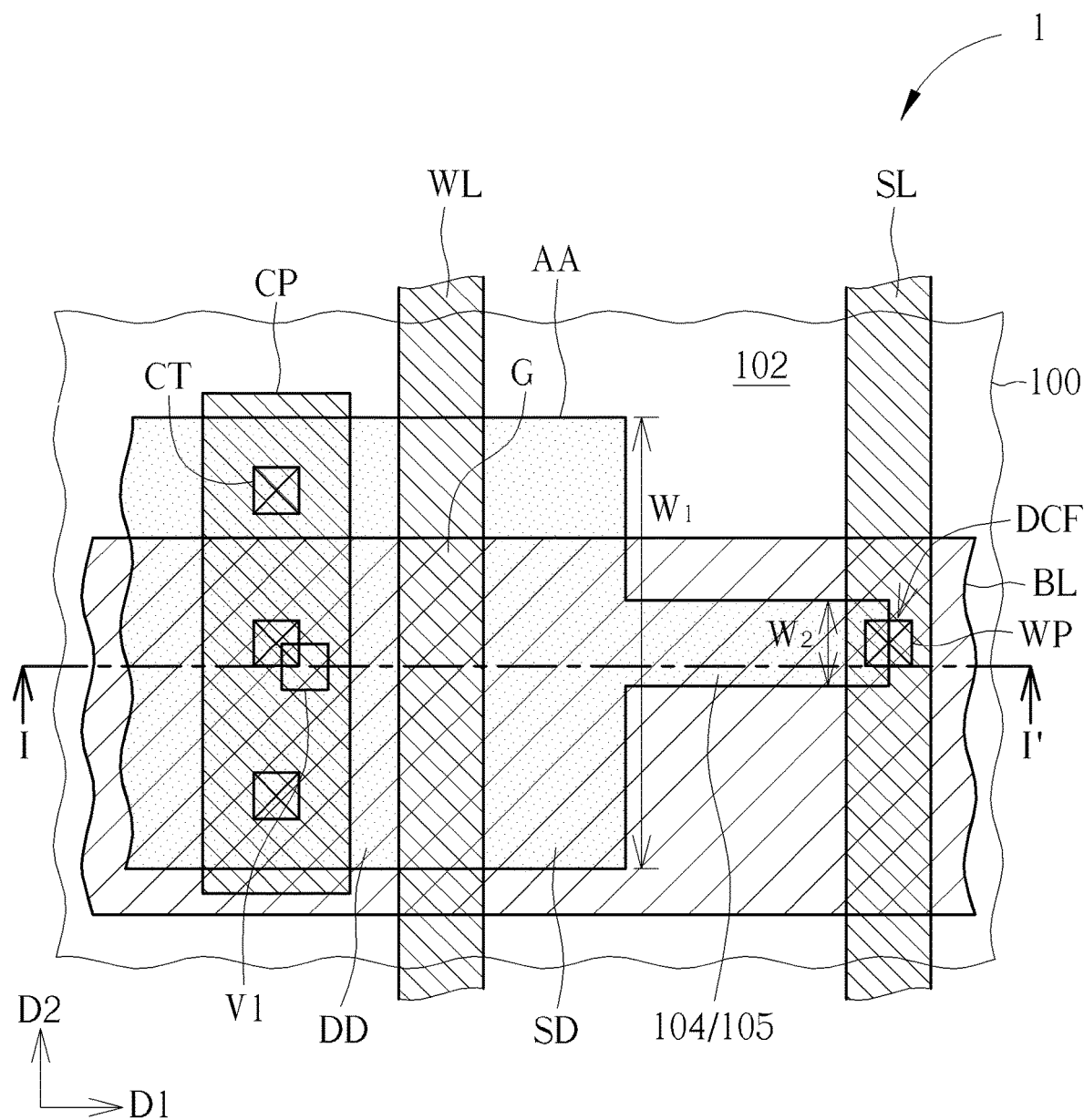
FIG. 1 is a schematic diagram showing the layout of the one-time programmable memory cell according to one embodiment of the present invention.
Figure 2:
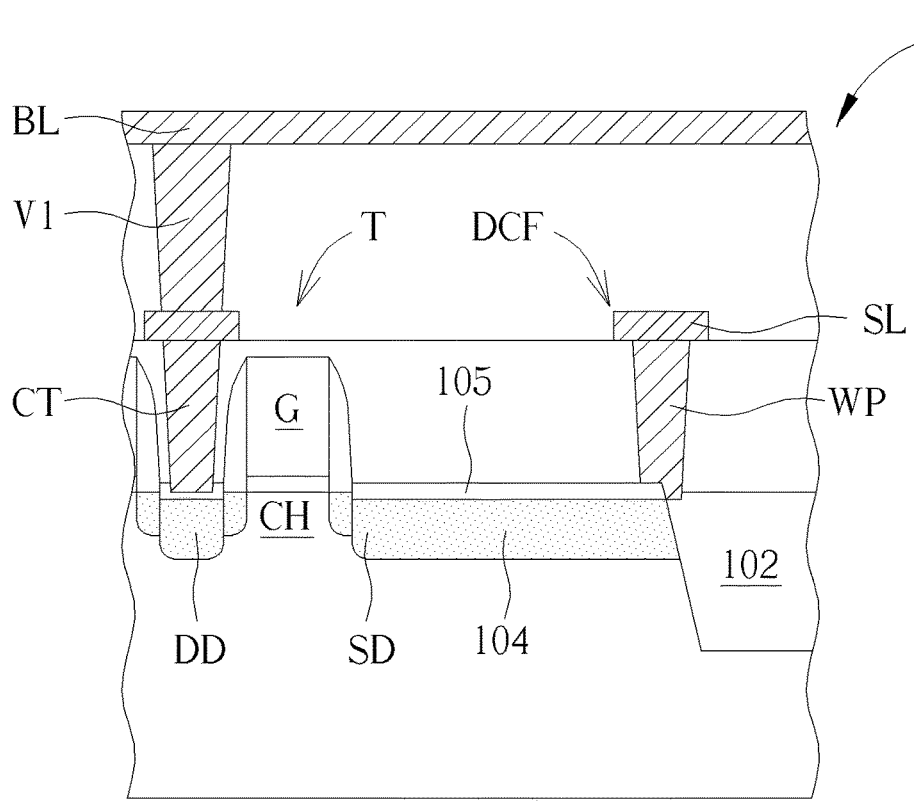
FIG. 2 is a schematic cross-sectional view taken along line I-I' in FIG. 1.

Please refer to FIG. 1 and FIG. 2. FIG. 1 is a schematic diagram of the layout of the one-time programmable memory cell of the present invention, and FIG. 2 is a schematic cross-sectional view taken along line I-I' in FIG. 1. As shown in FIG. 1 and FIG. 2, the one-time programmable memory cell 1 of the present invention includes a substrate 100, for example, a P-type doped silicon substrate. The substrate 100 includes an active area AA surrounded by an isolation region 102. According to an embodiment of the present invention, the isolation region 102 may be a shallow trench isolation (STI) region, and the active area AA may be a strip area extending along the first direction D1.

According to an embodiment of the present invention, the one-time programmable memory cell 1 further includes a transistor T disposed on the active area AA. According to an embodiment of the present invention, the one-time programmable memory cell 1 further includes a diffusion-contact fuse DCF electrically coupled to the transistor T.

According to an embodiment of the present invention, the transistor T includes a source doped region SD, a drain doped region DD, a channel region CH between the source doped region SD and the drain doped region DD, and a gate G above the channel area CH. It can be seen from FIG. 1 that the gate G can be a part of the word line WL extending along the second direction D2. According to an embodiment of the present invention, the transistor T may be an NMOS transistor.

According to an embodiment of the present invention, the diffusion-contact fuse DCF includes a diffusion region 104 in the active area AA, a silicide layer 105 on the diffusion region 104, and a contact WP. According to an embodiment of the present invention, the source doped region SD of the transistor T is adjacent to the diffusion region 104. According to an embodiment of the present invention, the contact WP is disposed at the distal end of the diffusion region 104 opposite to the source doped region SD, and the contact WP is partially overlapped with the silicide layer 105 and partially overlapped with the isolation region 102. According to an embodiment of the present invention, the contact WP can be used as a cathode, and the diffusion region 104 and the silicide layer 105 can be used as an anode.

According to an embodiment of the present invention, the contact WP may be electrically connected to a source line SL extending along the second direction D2. The drain doped region DD of the transistor T can be electrically connected to a bit line BL extending along the first direction D1 through a contact plug CT, a contact pad CP, and a via V1.

According to an embodiment of the present invention, as shown in FIG. 1, the diffusion region 104 is a strip-shaped or belt-shaped diffusion region extending along the first direction D1. According to an embodiment of the present invention, the width $w_1$ of the source doped region SD is greater than the width $w_2$ of the diffusion region 104.

According to an embodiment of the present invention, the diffusion region 104 may be an $N^+$ doped region. According to another embodiment of the present invention, the diffusion region 104 may be a $P^+$ doped region. If the diffusion region 104 is a $P^+$ doped region, a deep N well may be provided in the substrate 100. According to an embodiment of the present invention, the diffusion region 104 may have a conductivity type different from that of the source doped region SD. For example, the diffusion region 104 may be a $P^+$ doped region, and the source doped region SD may be an $N^+$ doped region. According to an embodiment of the present invention, the silicide layer 105 may include NiSi. According to an embodiment of the present invention, the contact WP may be a tungsten contact.

Figure 3:
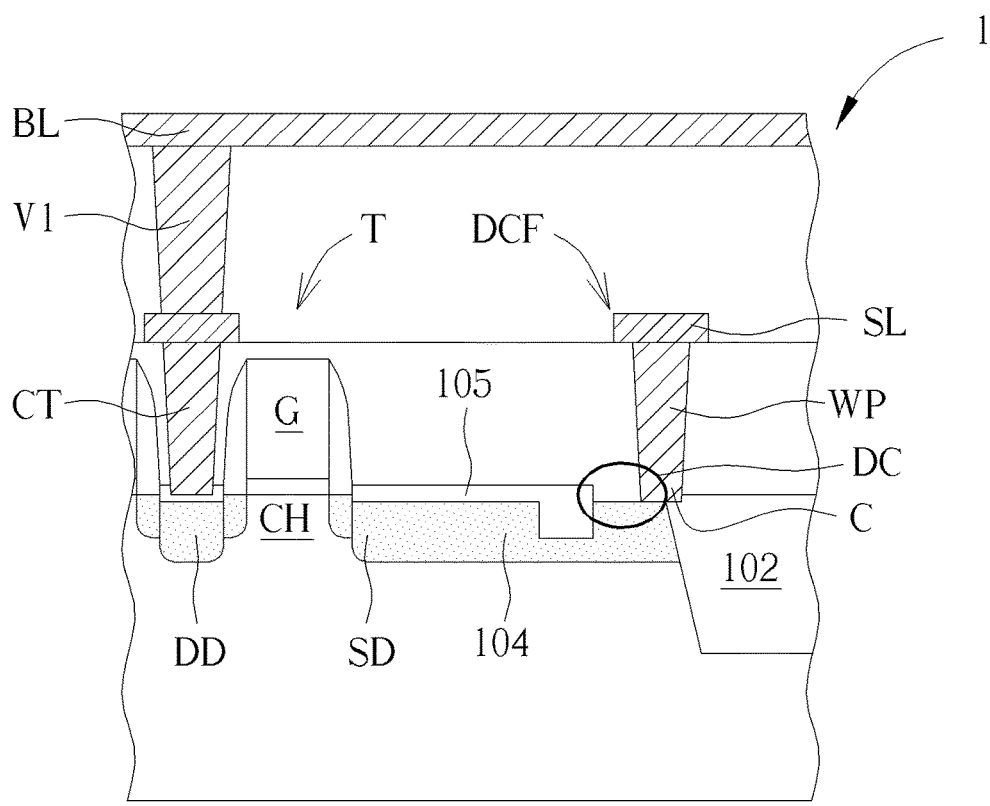
FIG. 3 to FIG. 5 illustrate possible states of the one-time programmable memory cell of the present invention after programming.
Figure 4:
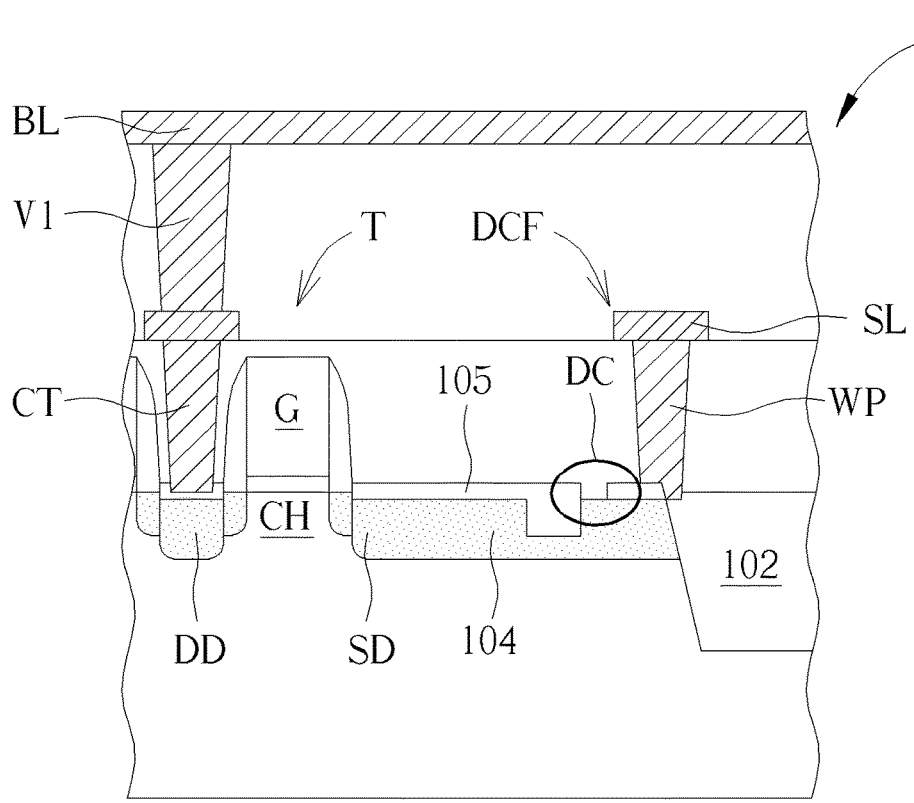
Figure 5:
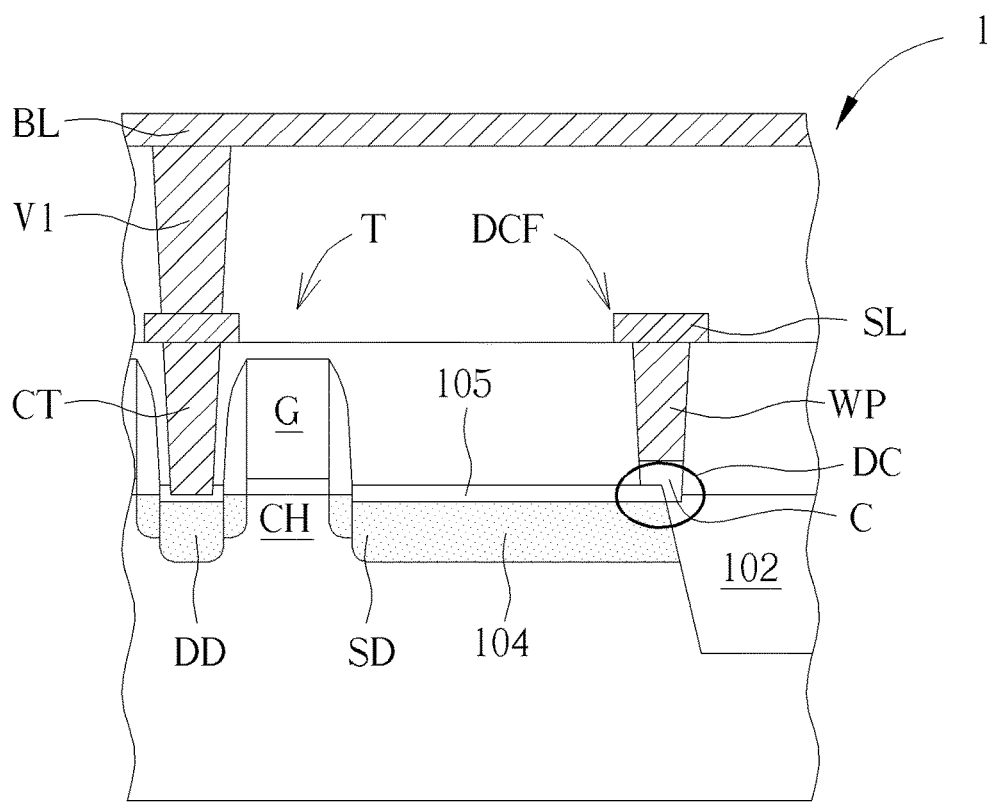

FIG. 3 to FIG. 5 illustrate possible states of the one-time programmable memory cell of the present invention after programming. As shown in FIG. 3, after programming, due to the electro-migration effect, the silicide layer 105 near the bottom of the contact WP is pushed to the anode end by the current, resulting in a disconnection DC, thereby forming a high resistance state (H state)). The bottom of the contact WP does not contact the silicide layer 105, and void C may be formed at the bottom of the contact WP.

As shown in FIG. 4, after programming, due to the electro-migration effect, the silicide layer 105 near the bottom of the contact WP is pushed to the anode end by current, but the disconnection DC occurs at a position slightly away from the bottom of the contact WP, thereby forming a high resistance state (H state). The bottom of the contact WP is still in contact with the silicide layer 105, and no void will be formed at the bottom of the contact WP.

As shown in FIG. 5, after programming, the tungsten metal at the bottom of the contact WP is pushed to the anode end by the current due to the electro-migration effect, so that the disconnection DC occurs at the bottom of the contact WP, forming void C.

Figure 6:
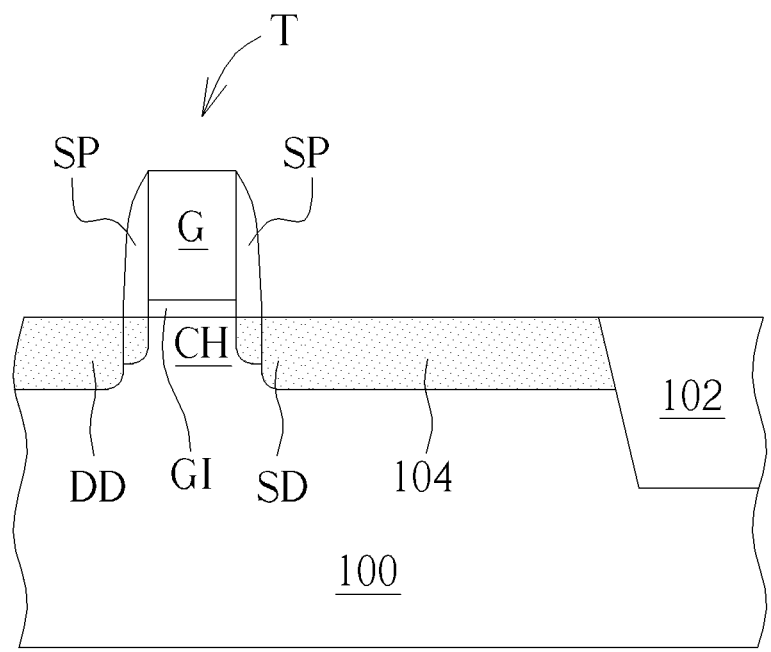
FIG. 6 to FIG. 8 are schematic diagrams showing a method of forming a one-time programmable memory cell according to an embodiment of the present invention.
Figure 7:
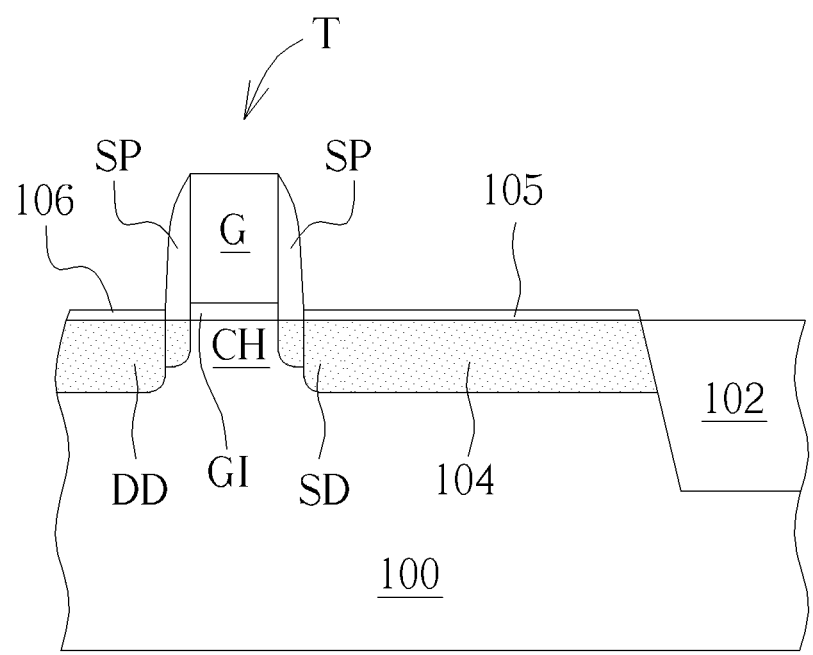
Figure 8:
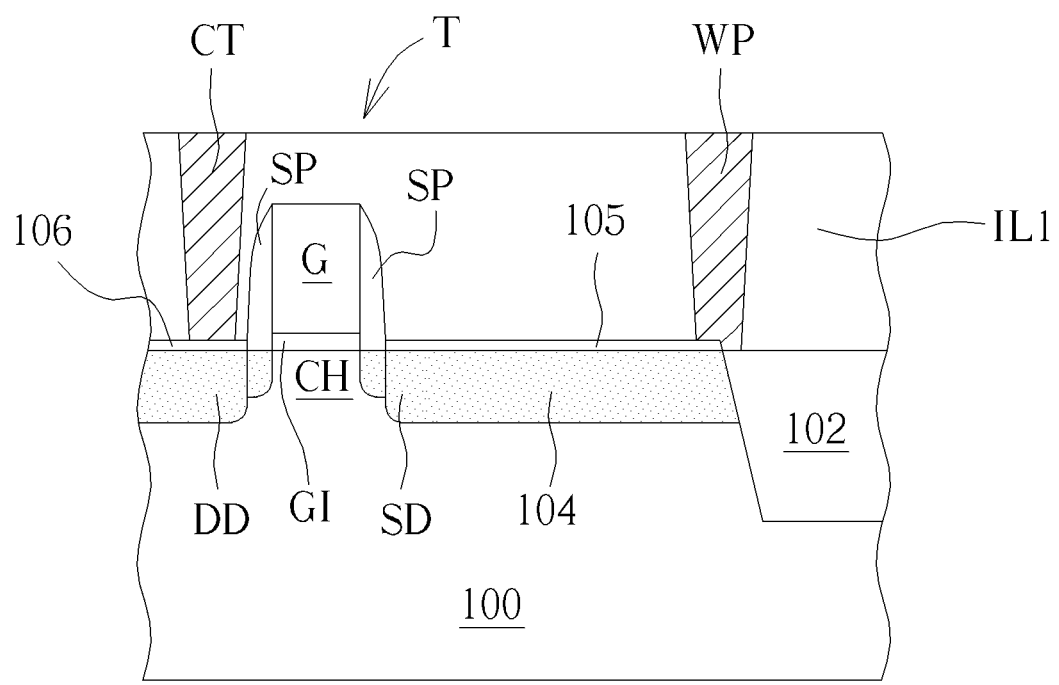

Please refer to FIG. 6 to FIG. 8, which are schematic diagrams of a method for forming a one-time programmable memory cell according to an embodiment of the present invention. As shown in FIG. 6, a substrate 100, for example, a P-type doped silicon substrate is provided. The substrate 100 includes an active area AA surrounded by an isolation region 102. A transistor T is then formed in the active area AA. According to an embodiment of the present invention, the transistor T may be an NMOS transistor.

According to an embodiment of the present invention, the transistor T includes a source doped region SD, a drain doped region DD, a channel region CH between the source doped region SD and the drain doped region DD, and a gate G above the channel area CH. According to an embodiment of the present invention, a gate dielectric layer GI may be formed between the gate G and the channel region CH. According to an embodiment of the present invention, a spacer SP may be formed on the sidewall of the gate G.

An elongated diffusion region 104 is formed in the active region AA adjacent to the source doped region SD. The width of the diffusion region 104 is smaller than the width of the source doped region SD. According to an embodiment of the present invention, the diffusion region 104 may be an $N^+$ doped region. According to another embodiment of the present invention, the diffusion region 104 may be a $P^+$ doped region. According to an embodiment of the present invention, the diffusion region 104 may have a conductivity type different from that of the source doped region SD.

As shown in FIG. 7, a self-aligned metal silicidation process is then performed to form a silicide layer 105 on the surface of the diffusion region 104 and the source doped region SD, and a silicide layer 106 is formed on the surface of the drain doped region DD. For example, the silicide layer 105 and the silicide layer 106 may include NiSi, but is not limited thereto. Since the above-mentioned self-aligned metal silicidation process is a well-known technique, its details will not be repeated. For example, a silicide block (SAB) pattern can be formed on the substrate 100, and then a metal layer is deposited in a blanket manner, and then the silicon and the metal layer are reacted to form a silicide layer by heat treatment or annealing, and the unreacted metal layer is removed.

As shown in FIG. 8, a dielectric layer IL1, such as a silicon oxide layer, is deposited on the substrate 100 in a blanket manner. Next, a contact WP and a contact plug CT are formed in the dielectric layer IL1. The contact plug CT is located on the drain doped region DD, and the contact WP is partially located on the silicide layer 105 and partially located on the isolation region 102. According to an embodiment of the present invention, the diffusion region 104 located in the active area AA, the silicide layer 105 on the diffusion region 104, and the contact WP constitute a diffusion-contact fuse DCF. According to an embodiment of the present invention, the contact WP can be used as a cathode, and the diffusion region 104 and the silicide layer 105 can be used as an anode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A one-time programmable (OTP) memory cell, comprising:
   a substrate comprising an active area surrounded by an isolation region;
   a transistor disposed on the active area, wherein the transistor comprises a source doped region, a drain doped region, a channel region between the source doped region and the drain doped region, and a gate above the channel region; and
   a diffusion-contact fuse electrically coupled to the transistor, wherein the diffusion-contact fuse comprises a diffusion region in the active area, a silicide layer on the diffusion region, and a contact partially landed on the silicide layer and partially landed on the isolation region, wherein the source doped region is contiguous with the diffusion region, wherein a width of the source doped region is greater than a width of the diffusion region.

2. The OTP memory cell according to claim 1, wherein the diffusion region comprises an $N^+$ doped region or a $P^+$ doped region.

3. The OTP memory cell according to claim 1, wherein the contact is disposed at a distal end of the diffusion region that is opposite to the source doped region.

4. The OTP memory cell according to claim 1, wherein the transistor is an NMOS transistor.

5. The OTP memory cell according to claim 1, wherein the diffusion region is a strip shaped diffusion region.

6. The OTP memory cell according to claim 1, wherein the silicide layer comprises NiSi.

7. The OTP memory cell according to claim 1, wherein the contact is a tungsten contact.

8. A method of forming a one-time programmable (OTP) memory cell, comprising:
   providing a substrate comprising an active area surrounded by an isolation region;
   forming a transistor on the active area, wherein the transistor comprises a source doped region, a drain doped region, a channel region between the source doped region and the drain doped region, and a gate above the channel region; and
   forming a diffusion-contact fuse electrically coupled to the transistor, wherein the diffusion-contact fuse comprises a diffusion region in the active area, a silicide layer on the diffusion region, and a contact partially landed on the silicide layer and partially landed on the isolation region, wherein the source doped region is contiguous with the diffusion region, wherein a width of the source doped region is greater than a width of the diffusion region.

9. The method according to claim 8, wherein the diffusion region comprises an $N^+$ doped region or a $P^+$ doped region.

10. The method according to claim 8, wherein the contact is disposed at a distal end of the diffusion region that is opposite to the source doped region.

11. The method according to claim 8, wherein the transistor is an NMOS transistor.

12. The method according to claim 8, wherein the diffusion region is a strip shaped diffusion region.

13. The method according to claim 8, wherein the silicide layer comprises NiSi.

14. The method according to claim 8, wherein the contact is a tungsten contact.

* * * * *